(12) United States Patent
Edo

(10) Patent No.: US 6,437,629 B1
(45) Date of Patent: Aug. 20, 2002

(54) SEMICONDUCTOR DEVICE WITH CIRCUIT FOR ADJUSTING INPUT/OUTPUT TERMINAL CAPACITANCE

(75) Inventor: Sachiko Edo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/543,333

(22) Filed: Apr. 5, 2000

(30) Foreign Application Priority Data

Apr. 5, 1999 (JP) .............................. 11-098186

(51) Int. Cl.[7] .............................. G06F 7/64; G06F 7/18
(52) U.S. Cl. ........................................ 327/334; 327/525
(58) Field of Search ................. 327/334, 344, 327/525

(56) References Cited

U.S. PATENT DOCUMENTS 5,742,206 A * 4/1998 Ishida ......................... 330/284
5,801,596 A * 9/1998 Sakurai ....................... 331/176
6,084,464 A * 7/2000 Lin ............................. 327/525
6,085,260 A * 7/2000 Nelson ......................... 710/20

FOREIGN PATENT DOCUMENTS

| JP | 61-187356 | 8/1986 |
| JP | 63-246916 | 10/1988 |

* cited by examiner

Primary Examiner—Terry D. Cunningham
Assistant Examiner—Quan Tra
(74) Attorney, Agent, or Firm—McGinn & Gibb, PLLC

(57) ABSTRACT

A semiconductor device of the invention comprises: an external terminal; an internal circuit connected to the external terminal; a MOS transistor whose gate terminal or common terminal of the drain and source is connected to the external terminal; and a bonding pad for applying a predetermined voltage to a terminal which is not connected to the external terminal of the MOS transistor.

8 Claims, 10 Drawing Sheets

SEMICONDUCTOR DEVICE WITH CIRCUIT FOR ADJUSTING INPUT/OUTPUT TERMINAL CAPACITANCE

BACKGROUND OF THE INVENTION

1. Field of the Invention

The present invention relates to a semiconductor device having a circuit for adjusting the capacitance in an input/output terminal.

2. Description of the Prior Art

In recent years, in order to increase the operating frequency in a semiconductor device, not only improvement in an packing technique in an integrated circuit chip but also improvement in a technique of mounting the integrated circuit chip onto a package are also important objects. For example, a case of transmitting data from a first semiconductor device to a second semiconductor device via a data bus of 32 bits and a clock signal line on a 1 GHz clock is assumed. When it is assumed that the cycle of one clock is 1 ns and the second semiconductor device captures data at the leading edge of a clock signal, data has to arrive at the second semiconductor device at least about 0.2 ns before. This requirement is called setup time. Even one bit out of the 32-bit data is late, that is, when the setup time is not satisfied, accurate data transfer cannot be performed. Consequently, the requirement of the setup time has to be satisfied with respect to all of the 32-bit data.

In the case of transmitting data from the first semiconductor device to the second semiconductor device, according to wiring resistance of a wire connecting the semiconductor devices and the capacitance for input/output terminals of the first and second semiconductor devices, data arrival time largely differs. In the case of a semiconductor device which operates at high frequencies of hundreds MHz to a few GHz, for example, the input capacitance in an external input/output terminal in a packed state is subject to strong constraints. The capacitance of the input/output terminal is not only reduced but, in some cases, has to be controlled within a range from a predetermined value and a value less than a value obtained by adding 1 pF to the predetermined value.

In a semiconductor device such as a storage, there are cases such that variation in capacitance among a plurality of signal lines in a data bus or the like has to be suppressed to a few hundredths pF. The capacitance of the external input/output terminal is determined by the input capacitance in an input/output device external pin (bonding pad or the like) of the integrated circuit chip in the package and the capacitance of a wire extending from the device external pin to the external input/output terminal of the package. It is therefore necessary to control the capacitance of the device external pin in consideration of the wiring in the package.

Further, in order to increase the packing density, the user of the semiconductor device sometimes wires a common data bus on both the surface and back of a single circuit substrate and mount a plurality of semiconductor devices. When semiconductor devices having the same pin arrangement are mounted on the surface and the back of the circuit substrate, since the wiring pattern on the surface and that on the back are largely different from each other, it is difficult to design the wiring patterns and it takes time to design the patterns. Further, when signals are simultaneously supplied to both terminals A and D (FIG. 13) of a semiconductor device via wiring patterns on the surface and back of the same pin assignment, on the surface, the signal arrives at the terminal A and after that the signal arrives at the terminal D.

On the contrary, on the back, the signal arrives at the terminal D and after that the signal arrives at the terminal A. In the semiconductor device which operates at very high speed, even the slight difference disturbs normal capture of the signal.

In order to avoid this, either terminal arrangement of a semiconductor device, pin assignment and mirror-symmetrical terminal arrangement, or a semiconductor device having pin assignment is necessary. By mounting semiconductor devices having a mirror symmetrical relation on the surface and back of the circuit substrate, a signal arrives at the terminal D after the signal arrives at the terminal A on both of the surface and back face and a screw is not easily caused.

FIGS. 13A and 13B are perspective views showing an example of wiring in a package adopting a BGA (Ball Grid Array) as one of CSPs (Chip Size Packages) as a package. FIGS. 13A and 13B show wiring states in packages when the pin arrays of the packages are made different symmetrically from each other by using the same integrated circuit chips. In FIG. 13A, a plurality of solder balls 201 are arranged on the back of a package substrate 200a. On the surface of the substrate 200a, an integrated circuit chip of the same size as that of the substrate 200a is mounted. Device external pins (pads) 202 of the integrated circuit chip are connected to the solder balls 201 on the back of the substrate via a plurality of wires 203a, 203b, 203c, 203d, 203e, . . . .

On the other hand, in FIG. 13B, the plurality of solder balls 201 on the back of a package substrate 200b are connected to the plurality of pads 202 on the surface of the substrate via a plurality of wires 204a, 204b, 204c, 204d, 204e, . . . .

In FIGS. 13A and 13B, only a part of the wires is shown and the other part is omitted. The positions of the device external pins on the integrated circuit chip are deviated to the lower side of the drawing and the intervals of the device external pins are irregular. The device external pins are therefore arranged asymmetrical with resect to the solder balls 201.

In the pin array shown in FIG. 13A, with respect to external terminals A, B and C (upper left) and terminals D and E (lower left) of the package, the solder balls 201 for the respective terminals are connected to the corresponding device external pins on the integrated circuit chip via the wires 203a, 203b, 203c, 203d, and 203e. In the following description, this will be called first pin assignment.

On the other hand, in the substrate 200b of FIG. 13B in which pins are assigned symmetrical with those in the substrate 200a, terminals A, B and C (lower left) are wired to the corresponding device external pins on the integrated circuit chip by the wires 204a, 204b and 204c shorter than the wires 203a, 203b and 203c, respectively. Terminals D and E (upper left) are wired by the wires 204d and 204e longer than the wires 203d and 203e. As shown in the example, even if the same chip is used and the package shape is the same, when the terminal array or pin assignment is different, the capacitance has to be adjusted in consideration of a difference in the wiring state due to the different terminal arrangement or pin assignment.

Conventional methods for adjusting the capacitance of an external pin include a method of providing a capacitor capable of changing the capacitance by an application voltage on an integrated circuit chip and adjusting the voltage applied to the capacitance, thereby adjusting output delay time (refer to, for example, Japanese Unexamined Patent Application No. 61-187356) and a method of connecting a capacitor provided on an integrated circuit chip to an output pin via a semiconductor switch and selecting an on/off state of the switch, thereby changing the capacitance value (refer to, for example, Japanese Unexamined Patent Application No. 63-246916).

In such conventional methods, however, in order to integrate a capacitor capable of varying the capacitance onto the same device, it is necessary to add a dedicated diffusion process or change the fabricating process itself. Since the device output pin and the capacitor for adjustment are connected to each other via a semiconductor switch, there is a problem such that adjustment of an input/output impedance is difficult when the circuit is an RF circuit due to an influence of parasite resistance, parasite capacitance, and the like caused by the semiconductor switch.

As one of circuits for adjusting capacitance to solve the problem of the conventional method, a circuit as shown in FIG. 14 can be mentioned. FIG. 14 is a circuit diagram showing a circuit configuration corresponding to one of a plurality of input/output device external pins (pads) in a semiconductor integrated device. An output circuit 302 as a buffer circuit for an output and an input circuit 303 as a buffer circuit for an input are connected to an input/output device external pin 301 via an aluminum wire 306 on the integrated circuit. The gate terminal of an n-channel MOS (Metal-Oxide Semiconductor) transistor 305 is disposed connectably to the input/output device external pin 301 via a switch 304. The drain and source terminals of the MOS transistor 305 are connected to the ground.

By the switch 304, the aluminum wire can be connected or interrupted. For example, every manufacturing lot, in the case of adding capacitance, by using a wiring mask of wiring in a state where the contact of the switch 304 is closed, the aluminum wire is formed at the contact of the switch on the integrated circuit. On the other hand, in the case of adding no capacitance, by using a wiring mask which does not form an aluminium wire at the contact of the switch 304, the switch is opened. In the case of adding the capacitance, the capacitor realized by the MOS transistor 305 can be connected to the input/output device external pin 301 directly via a low-resistance metal wire without through the semiconductor switch. Since the capacitor is realized by the MOS transistor, it is unnecessary to add a dedicated process.

FIG. 15 roughly shows the process for fabricating the semiconductor device. A wafer fabricating process (401), a diffusion process (402) and a wafer test process (403) are performed. A semiconductor chip which has passed the wafer test is assembled in a predetermined package in an assembly process (404) and a final test is carried out (405). A semiconductor device which has passed the final test is shipped (406). The aluminium wire is formed in the diffusion process 402. That is, the capacitance adjustment by the presence or absence of the aluminium wire as shown in FIG. 14 is performed before the wafer test process 403. The circuit characteristics of the device can be measured in the wafer test process 403. The adjustment of the input/output terminal capacitance by either forming the aluminium wire or not to correct characteristic variation in fabricating places and variation in lots in the diffusion process is performed based on a fabrication record, result of the test (404 in FIG. 15) after assembly, and the like. It brings about a problem such that the management of the fabricating process is complicated.

In the case of fabricating a product having a form of two kinds of pin arrays as described by referring to FIG. 13, the work in the diffusion process 402, that is, which aluminum wiring mask is to be used is determined according to the array used. In this case, when the aluminium wiring method in the diffusion process 402 is selected according to the number of devices to be shipped (406) kind by kind of the pin arrays, the number of devices to be shipped and the number of products at the end of the diffusion process can be made coincide with each other. Since the number of days from the wafer test process 403 after the diffusion process 402 to the shipment 406 is, for example, a few weeks or so, a large change in the necessary quantity cannot be promptly dealt with or it is necessary to hold a number of stocks.

SUMMARY OF THE INVENTION

An object of the invention is to provide a high-speed processing semiconductor device capable of easily managing and adjusting the capacitance of an input/output terminal.

According to the invention, a semiconductor device comprises: an external terminal; an internal circuit connected to the external terminal; a MOS transistor whose gate terminal is connected to the external terminal or whose drain and source have a common terminal connected to the external terminal; and a bonding pad for applying a predetermined voltage to a terminal which is not connected to the external terminal in the MOS transistor.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
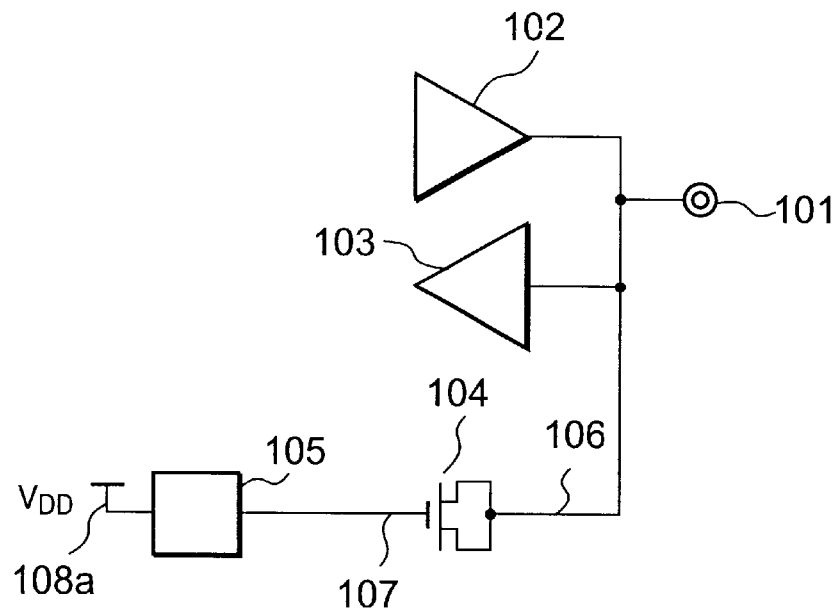
FIG. 1 is a circuit diagram showing an embodiment of the invention.
Figure 2:
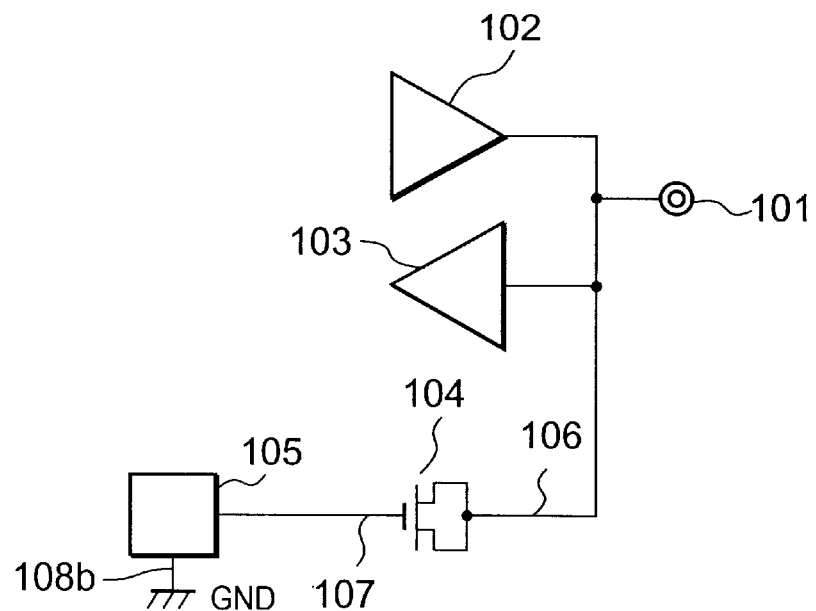
FIG. 2 is a circuit diagram showing an embodiment of the invention.

Embodiments of the invention will be described hereinbelow with reference to the drawings. FIGS. 1 and 2 are circuit diagrams each showing an embodiment of the invention. The configurations of FIGS. 1 and 2 are the same except for a voltage applied to a bonding pad 105, that is, bonding wiring. In FIGS. 1 and 2, a device external pin 101 is one of a plurality of external pins (pads) of a semiconductor integrated circuit device and is connected to the output terminal of an output circuit 102 as an output buffer of an internal circuit of the semiconductor integrated circuit device (not shown) and the input terminal of an input circuit 103 as an input buffer via a protection circuit (not shown). The device external pin 101 is electrically connected to the gate terminal of an n-channel MOS transistor 104 for capacitance correction. The drain and source of the MOS transistor 104 are connected to each other and are connected to the bonding pad 105 via an aluminum wire 107.

The gate terminal of the MOS transistor 104 is connected to the output terminal of the output circuit 102 and the input terminal of the input circuit 103. Since there is the possibility that the gate terminal is subjected to a static damage, it is desirable to connect the gate terminal between the protection circuit (not shown) and the input terminal of the input circuit 103 rather than directly connect it to the device external pin. The bonding pad 105 is a metal pad arranged in a position to which a wire may be bonded in a state where the semiconductor integrated circuit device is mounted on a package such as CSP. The MOS transistor 104 is formed in the same process as MOS transistors constructing other internal circuits of the semiconductor integrated circuit device.

In the configurations of FIGS. 1 and 2, it is assumed that the input/output interface of the semiconductor device is an interface circuit called an LVTTL (Low Voltage Transistor-Transistor Logic) or SSTL (Stub Series Terminated Logic) interface. In the LVTTL standard, it is specified that an input signal of the device external pin 101 is an RF signal having an amplitude of ±0.6 V of a reference voltage 1.4 V. In the SSTL standard, it is specified that an input signal is an RF signal having an amplitude of ±0.2 V of a reference voltage 1.5 V. In the example, it is assumed that a power supply voltage VDD is 2.5 V and a threshold voltage VT of a MOS transistor is approximately 0.7 V. In this case, as shown in FIG. 1, when the bonding pad 105 and the power supply voltage VDD are short-circuited by a bonding wire 108a, a potential difference (gate potential) between the gate of the MOS transistor and the source and drain becomes a negative potential which is sufficiently lower than the threshold voltage VT. Consequently, the capacitance between the gate and the source and drain decreases with respect to the RF signal.

On the other hand, as shown in FIG. 2, when the bonding pad 105 and the ground GND are short-circuited by a bonding wire 108b, the potential difference between the gate and the source and drain of the MOS transistor becomes a potential sufficiently higher than the threshold voltage VT, so that the capacitance is generated between the gate and the source and drain. By setting the potential applied to the bonding pad 105 to a power supply voltage VDD or a ground voltage VGND, the input capacitance of the device external pin 101 can be decreased or increased.

Although aluminum is used as a material of the wire in the above description, other metals such as molybdenum, tungsten and gold, and conductive substances such as silicide or salicide may be also used.

Although the gate terminal of the MOS transistor 104 is connected to the device external pin 101, as shown in parentheses in FIG. 1, a configuration such that the drain/source terminal is connected to the device external pin 101 and the gate terminal is connected to the bonding pad 105 may be also adopted.

Figure 14:
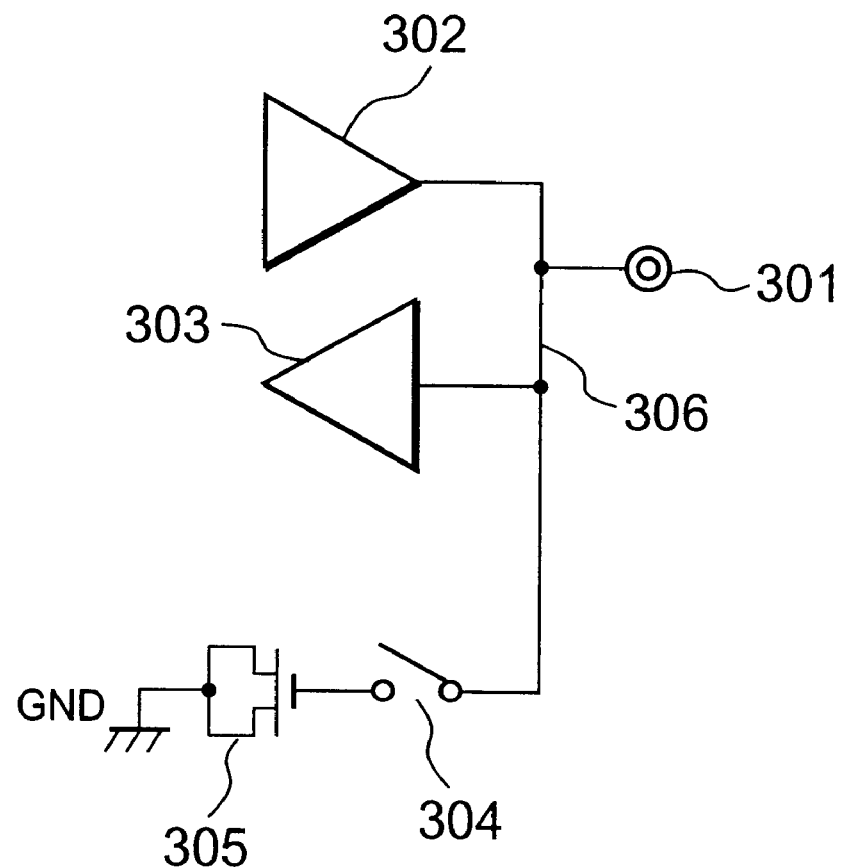
FIG. 14 is a circuit diagram of an external pin capacitance adjusting circuit in a conventional semiconductor device.

According to the embodiment of the invention described by referring to FIGS. 1 and 2, an additional capacitor (MOS transistor 104) to correct the capacitance can be connected to the device external pin (pad) of the semiconductor integrated circuit device by low-resistance connecting means, so that the input capacitance can be adjusted accurately. Since switching means such as a switch realized by presence/absence of an aluminum wire or a semiconductor switch is not provided between the device external pin 101 (pad) and the MOS transistor 104, parasite capacitance connected to the pad can be reduced and a high-processing speed semiconductor device can be realized. Since a bonding wire can be connected to the bonding pad after mounting the semiconductor integrated circuit device on the package, in the example shown in FIG. 15, the capacitance can be adjusted in the assembly process 404. As compared with the method of adjusting the capacitance by the presence or absence of the aluminium wire as shown in FIG. 14, a change in the package can be more flexibly dealt with.

Figure 3:
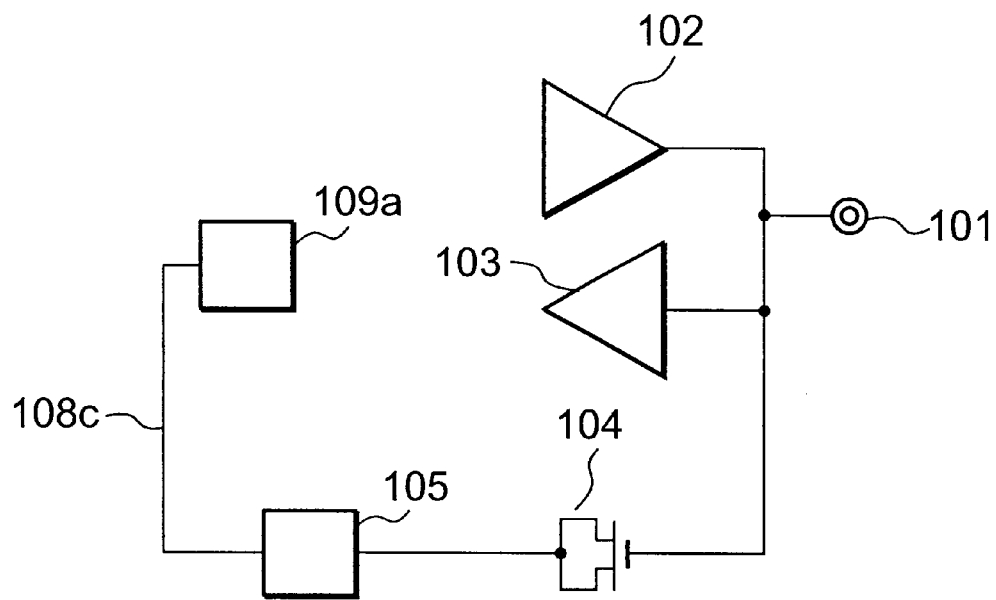
FIG. 3 is a circuit diagram showing a modification of the embodiment of FIG. 1.
Figure 4:
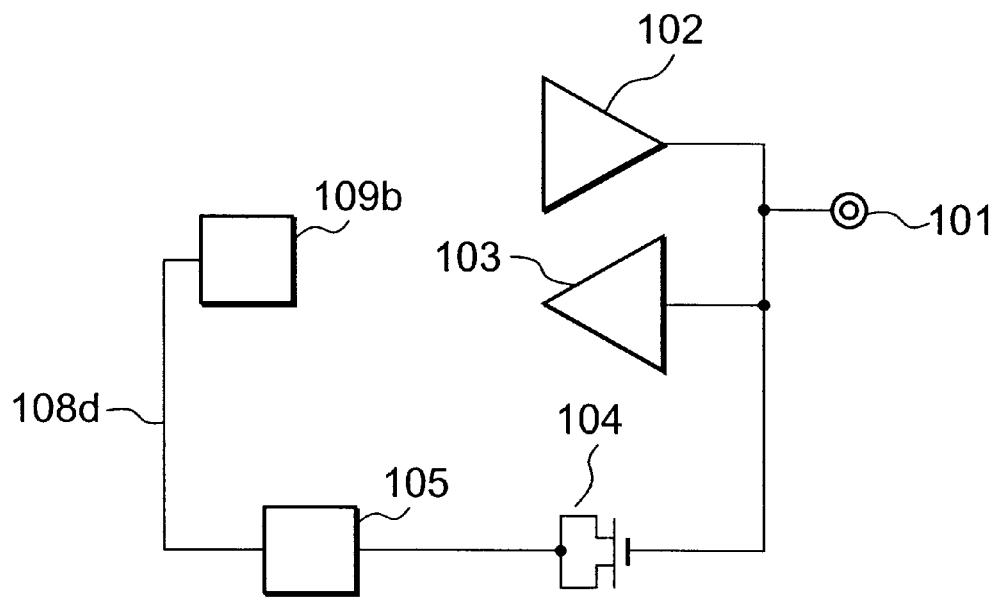
FIG. 4 is a circuit diagram showing a modification of the embodiment of FIG. 2.

With reference to FIGS. 3 and 4, modifications of the embodiments of the invention shown in FIGS. 1 and 2 will be described. The basic configurations from the device external pin 101 to the bonding pad 105 of circuits shown in FIGS. 3 and 4 are the same as those in FIGS. 1 and 2. The configuration of FIG. 3 is however different from that of FIG. 1 that the bonding pad 105 is connected not to the power supply voltage VDD but to a boot level pad 109a by wire bonding (108c). The boot level pad 109a is a bonding pad connected to a boot level voltage Vboot (such as about 5 V) generated in the semiconductor integrated circuit device. The shape of the boot level pad 109a is similar to that of the bonding pad 105. In the configuration shown in FIG. 3, a boot level voltage is applied to the drain/source terminal of the MOS transistor 104. The capacitance of the MOS transistor 104 can be therefore maintained low almost constantly with respect to the reference voltage from the ground level of the operating voltage of the device external pin 101 to the power supply voltage.

On the other hand, the configuration shown in FIG. 4 is different from that of FIG. 2 with respect to the point that the bonding pad 105 is connected not to the ground voltage VGND but to a substrate potential pad 109b by wire bonding (108d). The substrate potential pad 109b is a bonding pad for supplying a substrate voltage (substrate potential Vsub such as about −1.5 V) of the semiconductor integrated circuit device and has a shape similar to that of the bonding pad 105. In the configuration shown in FIG. 4, since the substrate voltage is applied to the drain/source terminal of the MOS transistor 104, the high capacitance of the MOS transistor 104 can be held almost constantly for the reference voltage ranging from the ground level in the operating voltage of the device external pin 101 to the power supply voltage.

According to the configurations of FIGS. 3 and 4, the invention can be applied not only to a semiconductor device having a reference voltage of about 1.5 V and a relatively small amplitude, such as a semiconductor device having therein an LVTTL or SSTL interface circuit but also to a semiconductor device for processing a signal of a large amplitude. The signal of a large amplitude denotes a signal having a maximum amplitude smaller than (Vboot−VT) and a minimum amplitude larger than (Vsub+VT) (where VT denotes a threshold voltage of the MOS transistor 104).

Figure 5:
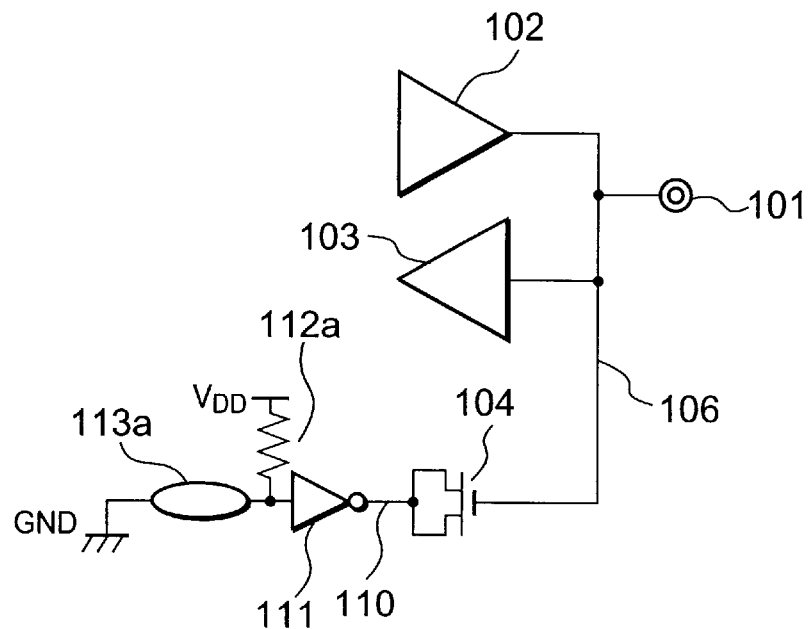
FIG. 5 is a circuit diagram showing another embodiment of a semiconductor device according to the invention.
Figure 6:
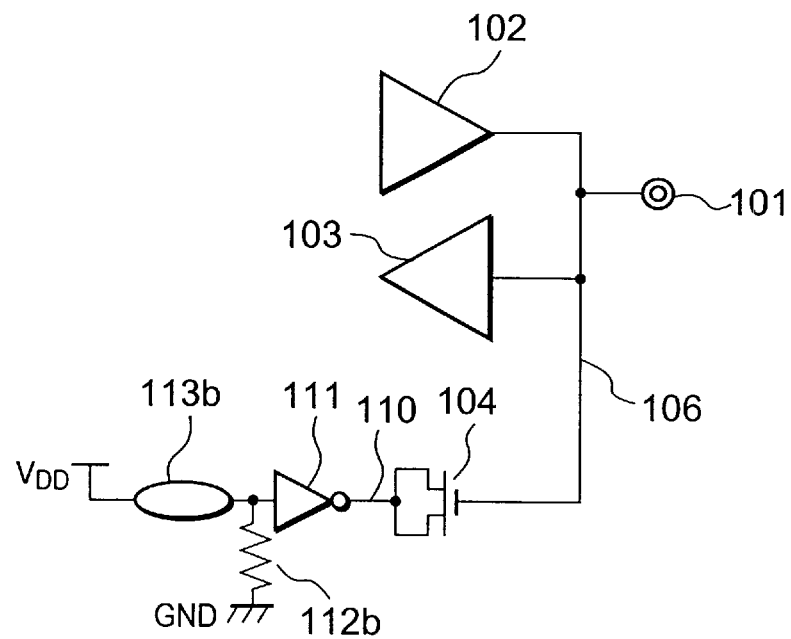
FIG. 6 is a circuit diagram showing another embodiment of the semiconductor device according to the invention.

Another embodiment of the semiconductor device according to the invention will now be described with reference to FIGS. 5 and 6. In a semiconductor device shown in FIGS. 5 and 6, a voltage applied to the drain/source terminal in the capacitance correcting MOS transistor 104 can be set by a fuse (113a or 113b) formed in the semiconductor integrated circuit device by using a MOS transistor or the like. In Figs.5 and 6, the same components as those shown in FIGS. 1 to 4 are designated by the same reference numerals and their description is omitted here.

In FIG. 5, one end of the fuse 113a is connected to the ground and the other end is connected to the input terminals of a resistor 112a and an inverter 111. The other end of the resistor 112a is connected to the power supply voltage VDD and an output of the inverter 111 is connected to the drain/source terminal of the MOS transistor 104 via a wire 110. On the other hand, in FIG. 6, one end of the fuse 113b is connected to the power supply voltage VDD and the other end is connected to the input terminals of a resistor 112b and the inverter 111. The other end of the resistor 112b is connected to the ground and an output of the inverter 111 is connected to the drain/source terminal of the MOS transistor 104 via the wire 110.

Figure 15:
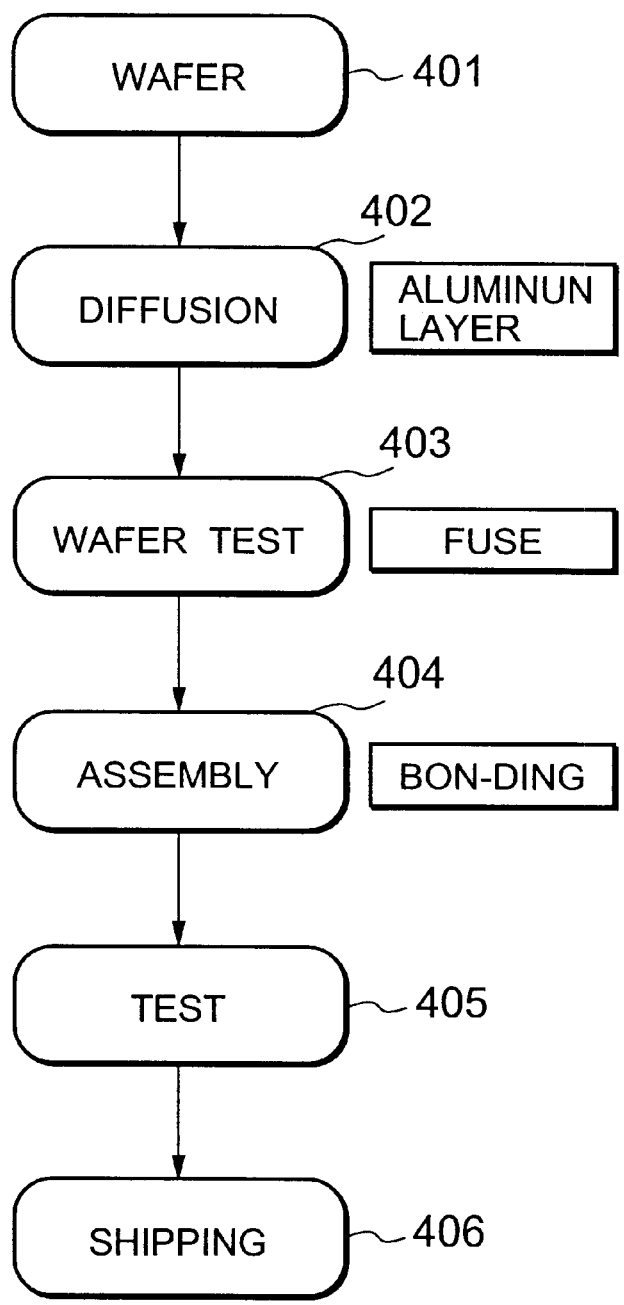
FIG. 15 is a diagram showing the flow of a process of fabricating a semiconductor device.

In the configuration, for example, the characteristics of the fabricated integrated circuit device are tested in the wafer test process 403 shown in FIG. 15 and the fuse 113a or 113b is interrupted according to the test result. In the configuration shown in FIG. 5, since the power supply voltage is applied to the drain/source terminal of the MOS transistor 104, the output of the inverter 111 becomes the ground voltage so that the capacitance of the MOS transistor 104 can be increased. In the configuration shown in FIG. 6, since the ground voltage is applied to the drain/source terminal of the MOS transistor 104, the output of the inverter 111 becomes the power supply voltage, so that the capacitance of the MOS transistor 104 can be decreased. On the other hand, in the state where the fuse 113a or 113b is not interrupted, in the configuration shown in FIG. 5, the power supply voltage is applied to the drain/source terminal of the MOS transistor 104, so that the capacitance of the MOS transistor 104 can be reduced. In the configuration shown in FIG. 6, the ground voltage is applied to the drain/source terminal of the MOS transistor 104, so that the capacitance of the MOS transistor 104 can be increased. Since the voltage at the ground or power supply level applied to the drain/source terminal of the MOS transistor 104 is supplied from the output terminal of the inverter 111, as compared with a case of supplying a voltage pulled up or down by a resistor or the like, it can be managed at a predetermined low impedance.

Further, even when the capacitance correcting MOS transistor 104 and the inverter 111 are arranged near the device external pin 101 and the fuse 113 is formed apart from them, the impedance for the device external pin 101 is the same. Consequently, the degree of freedom in layout design of the integrated circuit device can be improved.

The circuit for setting the input voltage of the inverter 111 shown in FIGS. 5 and 6 is not limited to the combination of a resistor and a fuse. For example, the resistor 112a or 112b can be replaced with a fuse. Also in the configurations shown in FIGS. 5 and 6, in a manner similar to FIGS. 1 and 2, a change in configuration such as a change in the connecting direction of the MOS transistor 104 is possible.

Figure 7:
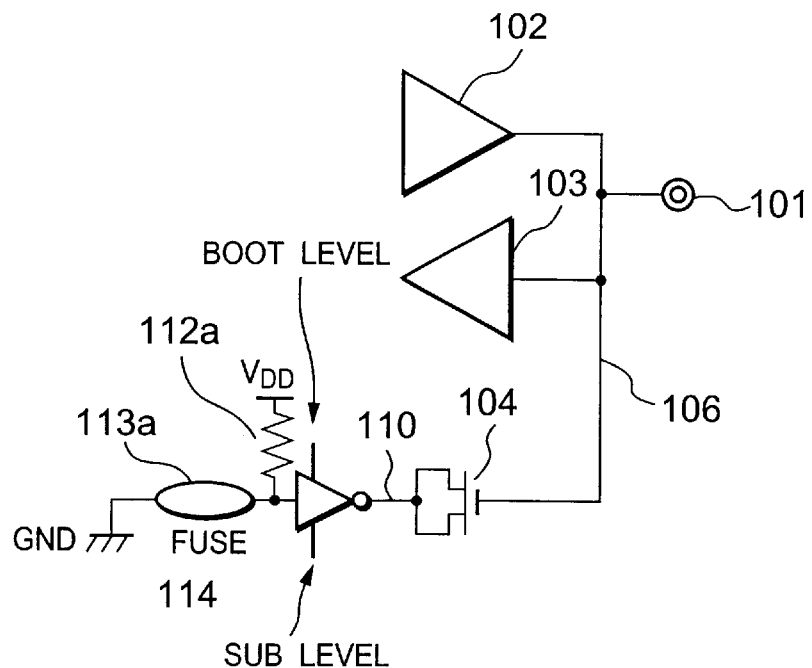
FIG. 7 is a circuit diagram showing a modification of the embodiment of FIG. 5.
Figure 8:
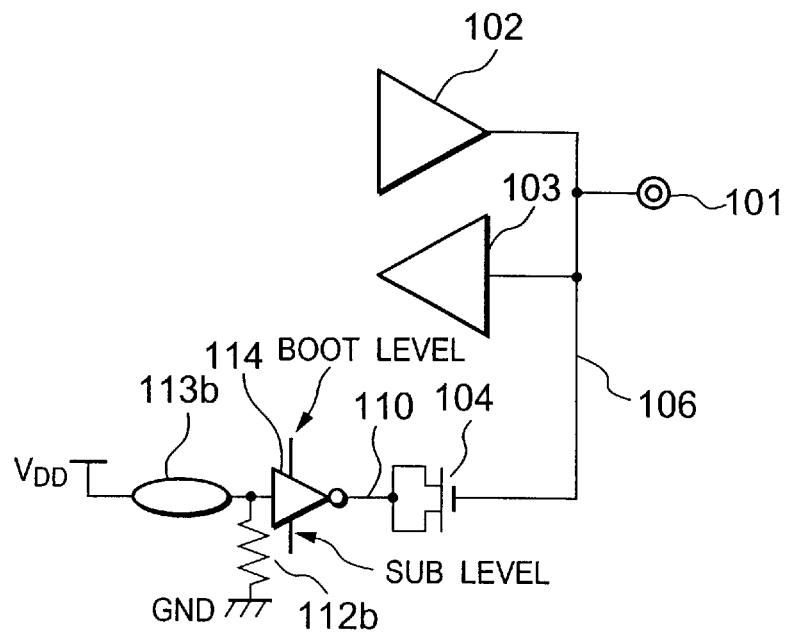
FIG. 8 is a circuit diagram showing a modification of the embodiment of FIG. 6.

Referring to FIGS. 7 and 8, a modification of the embodiment shown in FIGS. 5 and 6 will be described. A semiconductor device shown in FIGS. 7 and 8 has a configuration in which the inverter 111 for changing the output voltage in a range from the power supply voltage and the ground voltage is replaced by a voltage converting inverter 114 for changing the output voltage in a range from the boot level voltage to the substrate voltage (sub-level voltage). In the configurations shown in FIGS. 7 and 8, in a manner similar to FIGS. 5 and 6, depending on whether the fuse 113a or 113b is interrupted or not, the voltage applied to the drain/source terminal of the MOS transistor can be set to either the boot level voltage or the substrate voltage. In a manner similar to FIGS. 3 and 4, the reference voltage in the range from the power supply voltage to the ground voltage of an input/output signal in the device external pin 101 can be permitted.

Figure 9:
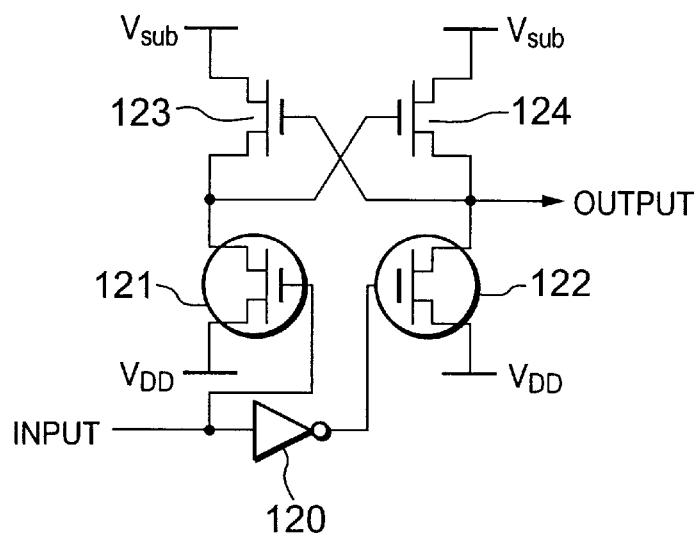
FIG. 9 is a circuit diagram showing an example of the configuration of a voltage converting inverter 114 illustrated in FIGS. 5 and 6.
Figure 10:
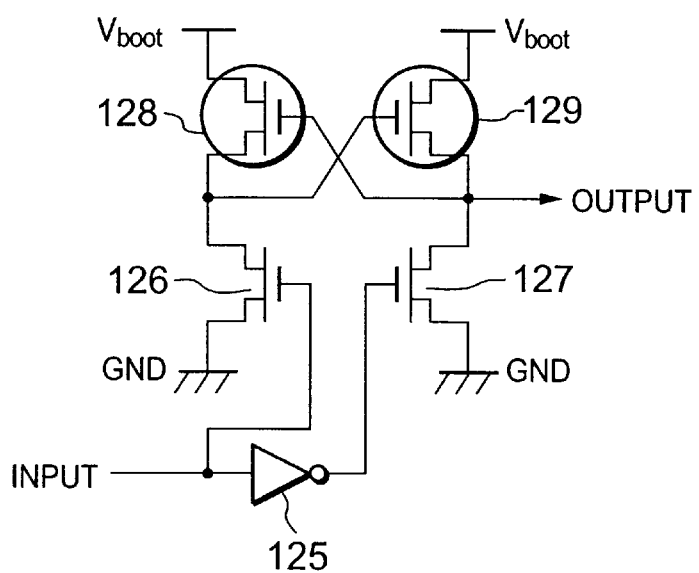
FIG. 10 is a circuit diagram showing another example of the configuration of the voltage converting inverter 114 illustrated in FIGS. 5 and 6.

FIGS. 9 and 10 are circuit diagrams showing examples of the configuration of the inverter 114 shown in FIGS. 7 and 8. FIG. 9 shows a circuit for converting the input voltage in the range from the power supply voltage VDD to the ground voltage VGND to the output voltage in the range from the substrate voltage Vsub to the power source voltage VDD. Both the source terminal of a p-channel MOS transistor 121 whose gate terminal is connected to the input terminal of an inverter 120 and the source terminal of a p-channel MOS transistor 122 whose gate terminal is connected to the output terminal of the inverter 120 are connected to the power supply voltage VDD. The drain terminal of the MOS transistor 121 is connected to the drain terminal of an n-channel MOS transistor 123. The drain terminal of the MOS transistor 122 is connected to the drain terminal of an n-channel MOS transistor 124. Both the source terminals of the MOS transistors 123 and 124 are connected to the substrate voltage Vsub. The gate terminal of the MOS transistor 123 is connected to the drain terminal of the MOS transistor 124 and the gate terminal of the MOS transistor 124 is connected to the drain terminal of the MOS transistor 123. In the configuration, the input signal in the range from the power supply voltage VDD to the ground voltage VGND supplied to the input terminal of the inverter 120 is converted into a signal which changes in the range from the substrate voltage Vsub to the power supply voltage VDD and the resultant signal is outputted from the connection point of the MOS transistors 122 and 124.

FIG. 10 shows a circuit for converting the input voltage in the range from the power supply voltage VDD to the ground voltage VGND into the output voltage in the range from the ground voltage VGND to the boot voltage Vboot. Both the source terminal of an n-channel MOS transistor 126 whose gate terminal is connected to the input terminal of an inverter 125 and the source terminal of an n-channel MOS transistor 127 whose gate terminal is connected to the output terminal of the inverter 125 are connected to the ground voltage VGND. The drain terminal of the MOS transistor 126 is connected to the drain terminal of a p-channel MOS transistor 128. The drain terminal of the MOS transistor 127 is connected to the drain terminal of a p-channel MOS transistor 129. The source terminals of the MOS transistors 128 and 129 are connected to the boot level voltage Vboot. The gate terminal of the MOS transistor 128 is connected to the drain terminal of the MOS transistor 129. The gate terminal of the MOS transistor 129 is connected to the drain terminal of the MOS transistor 128. In the configuration, the input signal in the range from the power supply voltage VDD to the ground voltage VGND applied to the input terminal of the inverter 125 is converted to a signal which changes within the range from the ground voltage VGND to the boot level voltage Vboot and the resultant signal is outputted from the connection point of the MOS transistors 127 and 129.

Figure 11A:
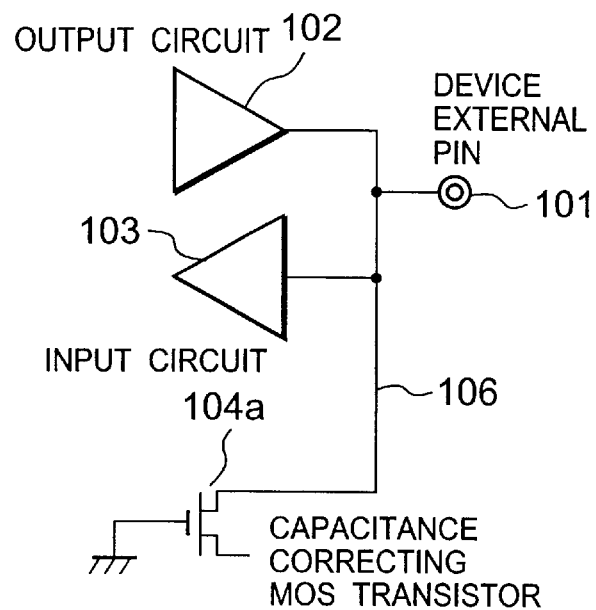
FIGS. 11A and 11B are circuit diagram showing a modification of the embodiments shown in FIGS. 1 to 8.
Figure 11B:
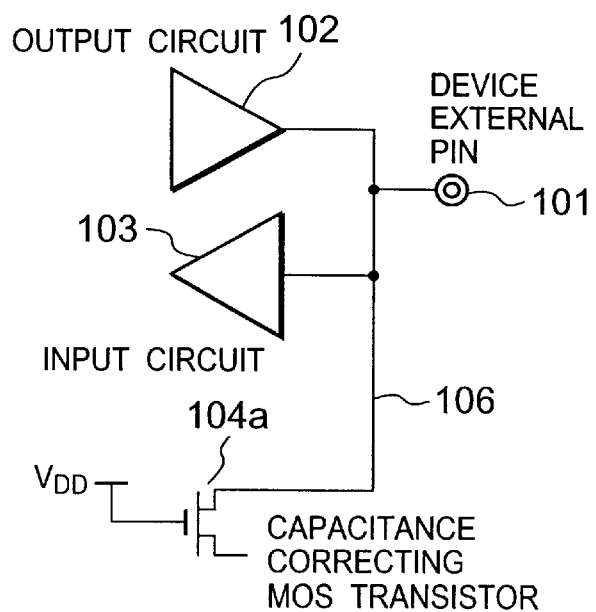

In the embodiments shown in FIGS. 1 to 8, both the source and drain terminals of the MOS transistor 104 are connected to the device external pin 101. In a modification shown in FIGS. 11A and 11B, the source terminal or drain terminal of a MOS transistor 104a is connected to the device external pin 101, the drain terminal or source terminal is made open, and the gate terminal is connected to voltage applying means. In such a configuration, by making the gate terminal bear the ground potential VGND, the capacitance of the MOS transistor 104a becomes low (FIG. 11A). By making the gate terminal bear the power supply potential VDD, the capacitance of the MOS transistor 104a becomes high (FIG. 11B).

Figure 12:
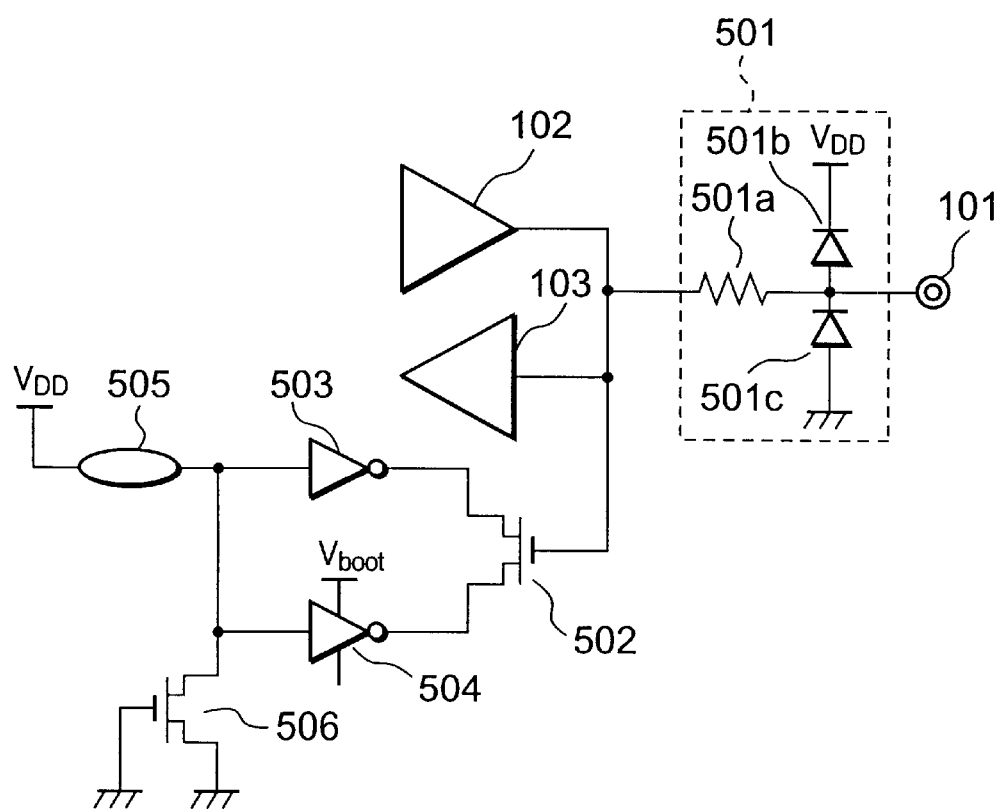
FIG. 12 is a circuit diagram showing further another embodiment of the semiconductor device according to the invention.
Figure 13A:
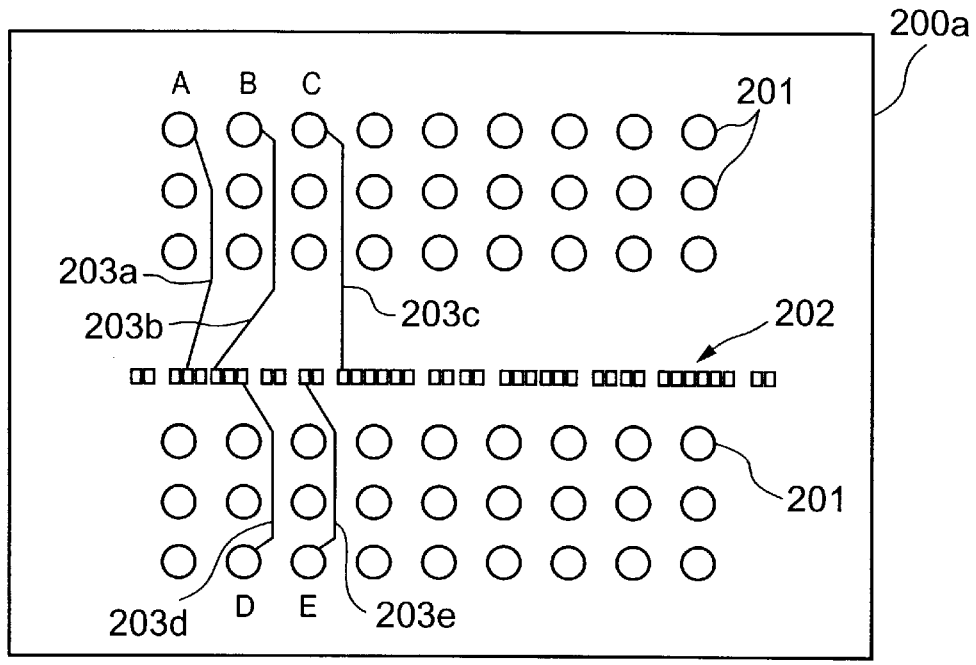
FIGS. 13A and 13B are diagrams showing wiring states of CSPs having different pin arrangement.
Figure 13B:
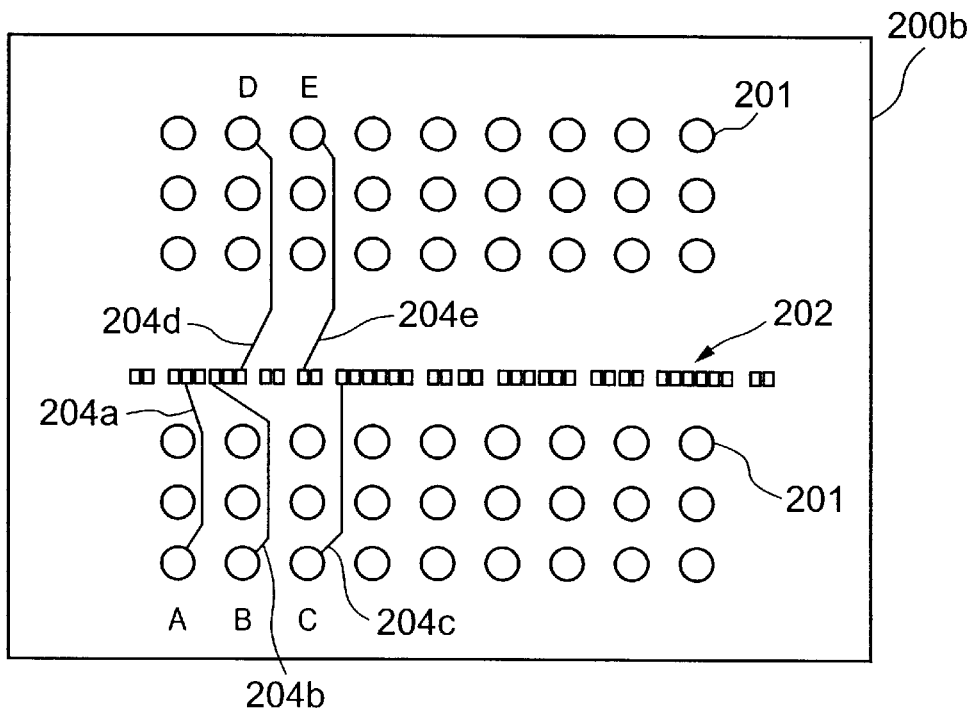

Further another embodiment of the invention will now be described with reference to FIG. 12. In the embodiment shown in FIG. 12, the wiring of the capacitance correcting MOS transistor is made different from those of the foregoing embodiments. FIG. 12 shows an example of an input protection circuit (501), which has been omitted in each of the above-mentioned embodiments, provided between the device external pin 101 and the input and output circuits 102 and 103.

In the embodiment, the gate terminal of an n-channel MOS transistor 502 for capacitance correction is connected to both the output terminal of the output circuit 102 and the input terminal of the input circuit 103. Either the drain or source terminal of the MOS transistor 502 is connected to the output of an inverter 503. The other terminal is connected to the output terminal of an inverter 504. The input terminal of each of the inverters 503 and 504 is connected to both one end of a fuse 505 and the drain terminal of an n-channel MOS transistor 506. The inverter 503 operates by using VDD as the power supply voltage and the inverter 504 operates by using the boot level voltage Vboot as a source voltage. The other end of the fuse 505 is connected to the power supply voltage VDD. Both the source terminal and the gate terminal of the MOS transistor 506 are connected to the ground. In this case, the MOS transistor 506 is a transistor having a depletion type operating mode and functions as a constant current load (load element).

The input protection circuit 501 comprises: a resistor 501a connecting the device external pin 101 and the input and output circuits 102 and 103; a diode 501b whose anode is connected to the device external pin 101 and whose cathode is connected to the power supply voltage VDD; and a diode 501c whose cathode is connected to the device external pin 101 and whose anode is connected to the ground voltage VGND.

In such a configuration, according to the embodiment, by selecting the connection or interruption of the fuse 505, the input capacitance can be adjusted in a manner similar to the above-described embodiments.

An example of a specific effect of the embodiment of the invention described above will now be described. In a semiconductor device which operates at high speed, for example, at a frequency of 200 MHz or higher, there is a case such that the input capacitance of a pin is strictly regulated in order to assure the operation on the system. In the semiconductor device which is required to operate at high speed, for example, a pin capacitance has to be in the range from 2 pF to 2.4 pF. The capacitance difference ($\Delta$Ci) between pins has to be 0.04 pF or less. In order to satisfy the requirement of $\Delta$Ci, the capacitance for correction has to be added to a pin of a small capacitance. The pin capacitance is determined by the capacitance of the package and the capacitance of the device. Consequently, when there are packages A and B of different product specifications and a capacitance correcting value in the device is determined according to the case where the device is mounted in the package A, $\Delta$Ci cannot be satisfied by the package B. Conventionally, two kinds of devices having different aluminum wires according to the packages have to be fabricated in order to satisfy the requirement. By utilizing the invention, however, the pin capacitance can be adjusted by changing the bonding wire of the bonding pad or the interrupting state of the fuse. Even when the same products are mounted on different packages, the requirement of $\Delta$Ci can be satisfied.

The invention is not limited to the embodiments but can be variously changed within the spirit and scope of the invention. For example, a capacitance adjusting circuit using a bonding pad and a capacitance adjusting circuit using a fuse are mounted mixedly on a single semiconductor integrated device, or the input voltage of the inverter 111 or 114 can be changed by using a bonding pad instead of a fuse.

Although the case of using the n-channel MOS transistor has been described above, a similar function can be realized also by using a p-channel MOS transistor. In the case of using the p-channel MOS transistor, however, the higher the gate potential is with respect to the source/drain potential, the more the capacitance between the gate and the source and drain decreases. The lower the gate potential is, the more the capacitance increases.

Although the case of providing each device external pin 101 with the voltage applying means has been described above, it is also possible to connect the capacitance correcting MOS transistor 104 to each of a plurality of device external pins 101 and commonly connect the other ends to a single voltage applying means.

Although the invention has been described with reference to specific embodiments, this description is not meant to be construed in a liming sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device comprising:
    an external terminal;
    an internal circuit connected to said external terminal;
    a metal oxide semiconductor (MOS) transistor whose gate terminal or common terminal of the drain and source is connected to said external terminal; and
    voltage applying means for applying a predetermined voltage to a terminal which is not connected to said external terminal of said MOS transistor,
    wherein said voltage applying means includes an inverter circuit whose output terminal is connected to a terminal which is not connected to said external terminal of said MOS transistor, and a circuit for determining a voltage applied to said inverter circuit, having a fuse element and a resistive element.

2. The semiconductor device according to claim 1, wherein said voltage applying means applies one of a power supply voltage, a ground voltage, a boot level voltage higher than said power supply voltage, and a substrate voltage lower than said ground voltage to a terminal which is not connected to said external terminal of said MOS transistor.

3. The semiconductor device according to claim 1, wherein said voltage applying means applies a voltage always having a positive or negative potential difference larger than a threshold voltage of said MOS transistor with respect to an operating voltage of a terminal connected to said external terminal of said MOS transistor, to a terminal which is not connected to said external terminal of said MOS transistor.

4. The semiconductor device according to claim 1, wherein said internal circuit and said MOS transistor are fabricated in a same process.

5. A semiconductor device comprising:
   an external terminal;
   an internal circuit connected to said external terminal;
   a MOS transistor whose gate terminal or common terminal of the drain and source is connected to said external terminal; and which is not connected to said external terminal of said MOS transistor;
   wherein said predetermined voltage applicator includes an inverter circuit whose output terminal is connected to a terminal which is not connected to said external terminal of said MOS transistor, and a circuit for determining a voltage applied to said inverter circuit, having a fuse element and a resistive element.

6. The semiconductor device according to claim 5, wherein said predetermined voltage applicator applies one of a power supply voltage, a ground voltage, a boot level voltage higher than said power supply voltage, and a substrate voltage lower than said ground voltage to a terminal which is not connected to said external terminal of said MOS transistor.

7. The semiconductor device according to claim 5, wherein said predetermined voltage applicator applies a voltage always having a positive or negative potential difference larger than a threshold voltage of said MOS transistor with respect to an operating voltage of a terminal connected to said external terminal of said MOS transistor, to a terminal which is not connected to said external terminal of said MOS transistor.

8. The semiconductor device according to claim 5, wherein said internal circuit and said MOS transistor are fabricated in a same process.

* * * * *